United States Patent [19]

Yarborough, Jr.

[11] Patent Number: 4,583,053
[45] Date of Patent: Apr. 15, 1986

[54] PHASE DETECTOR INSENSITIVE TO MISSING PULSES

[75] Inventor: John M. Yarborough, Jr., Palo Alto, Calif.

[73] Assignee: Signetics Corporation, Sunnyvale, Calif.

[21] Appl. No.: 619,093

[22] Filed: Jun. 11, 1984

[51] Int. Cl.⁴ .............................................. H03D 13/00
[52] U.S. Cl. .................................... 331/1 A; 328/133; 331/27
[58] Field of Search ........................... 331/25, 27, 1 A; 328/133, 134, 155; 307/516, 525, 526

[56] References Cited

U.S. PATENT DOCUMENTS

| | | | |
|---|---|---|---|
| 3,614,635 | 10/1971 | La Pine et al. | 331/1 A X |
| 3,986,125 | 10/1976 | Eibner | 328/133 X |
| 4,371,974 | 2/1983 | Dugan | 328/133 X |
| 4,380,815 | 4/1983 | Clendening | 328/133 X |
| 4,408,165 | 10/1983 | Braun | 328/134 |

Primary Examiner—Siegfried H. Grimm
Attorney, Agent, or Firm—Robert T. Mayer; Bernard Franzblau

[57] ABSTRACT

A phase detector for use with a phase locked loop where the input has missing pulses. The detector processes two input frequencies and generates either a pump-up or a pump-down signal on separate outputs. The reference input may have missing transitions, as often happens in recovering the clock from encoded data. The phase detector comprises three bistable flip-flops and a gate interconnected to respond to the two input frequencies to produce either a pump-up pulse of variable width proportional to the phase difference between the pulses of the two input frequencies or a fixed width pump-down pulse.

9 Claims, 3 Drawing Figures

PHASE DETECTOR INSENSITIVE TO MISSING PULSES

BACKGROUND OF THE INVENTION

1. Field of the Invention

This invention pertains to the general field of phase detectors for use with phase locked loops and in particular pertains to the use of a phase detector in a circuit where input pulses may be missing.

2. Description of the Prior Art

The initial acquisition of a phase locked loop when used for timing or carrier extraction is a significant practical problem since the narrow bandwidth generally required for jitter requirements severely restricts the pulling range. In the prior art many methods have been used to effect the acquisition. These methods are summarized in an article entitled "Frequency Detectors for PLL Acquisition in Timing and Carrier Recovery", David G. Messerschmitt, IEEE Transactions on Communications, Vol. -27, No. 9, September 1979. This article summarizes a significant relevant portion of the prior art. U.S. Pat. Nos. 4,308,505; 3,458,823; 4,363,004 and this article all show the same arrangement of a phase detector, a frequency detector, a filter and a voltage controlled oscillator as used in the type of circuit for which the present invention would be used, except that the input to the frequency detector in the present invention is from a crystal oscillator, while this input is the regular data signal in these four references. This difference of input results in a completely different operation. The circuit of the present invention works on different principles than those disclosed in the prior art.

SUMMARY OF THE INVENTION

The phase detector circuit of the present invention is a combination of digital logic elements. This circuit receives two input frequencies and generates a pump-up/pump-down signal for the control of a phase locked loop. The detector of this circuit has separate outputs for pump-up/pump-down. This detector has a linear relationship between the phase error and the pump-up pulse width, but a fixed pump-down pulse width for all phase errors for which this signal is generated. The two frequency inputs are a reference input and an input from a voltage controlled oscillator. The input signal from the voltage controlled oscillator must be continuous but the reference signal may have one or more missing transitions. The phase detector circuit utilizes three interconnected flip-flops, all of which are initially in the reset or zero state. When a rising edge occurs on the reference signal while the voltage controlled oscillator signal is low, the first flip-flop is set and the pump-up signal becomes active. When the voltage controlled oscillator signal goes high, the output of an inverter goes low, resetting the first flip-flop and terminating the pump up signal. The output of the inverter also prevents the first flip-flop from being set by positive transitions of the reference signal as long as the voltage controlled oscillator signal is high. If a rising edge occurs on the reference signal when the voltage controlled oscillator signal is high, a second flip-flop is set on the following falling edge of a signal from the voltage controlled oscillator, the output of the inverter goes from low to high and a third flip-flop is set, thus causing the Q side of the third flip-flop to go low and clear the second flip-flop. When the third flip-flop is set, the pump-down signal is active. When the voltage controlled oscillator signal returns to its high state, the output of an OR-GATE goes low and the third flip-flop is cleared, deactivating the pump-down signal. This logic causes the pump-up signal to be active from a rising edge of the reference signal that occurs when the signal from the voltage controlled oscillator is low until the voltage controlled oscillator rises, while the pump-down signal is active for the full low half clock period that follows a rising edge on the reference signal which occurred during a clock (VCO) high time. The effect of this operation is different from circuits known in the prior art. A normal linear relationship between phase error for both pump-up and pump-down results in a phase error probability distribution that is Gaussian, centered at the zero error. In this circuit, the resulting distribution is similar except that for a voltage controlled oscillator with a positive characteristic the distribution is centered about a point at which the input is leading the voltage controlled oscillator by some phase difference. The exact location is determined by the ratio of the two external resistors connected from pump-up and pump-down to the loop's integrating capacitor.

DESCRIPTION OF THE PREFERRED EMBODIMENT

Figure 1:
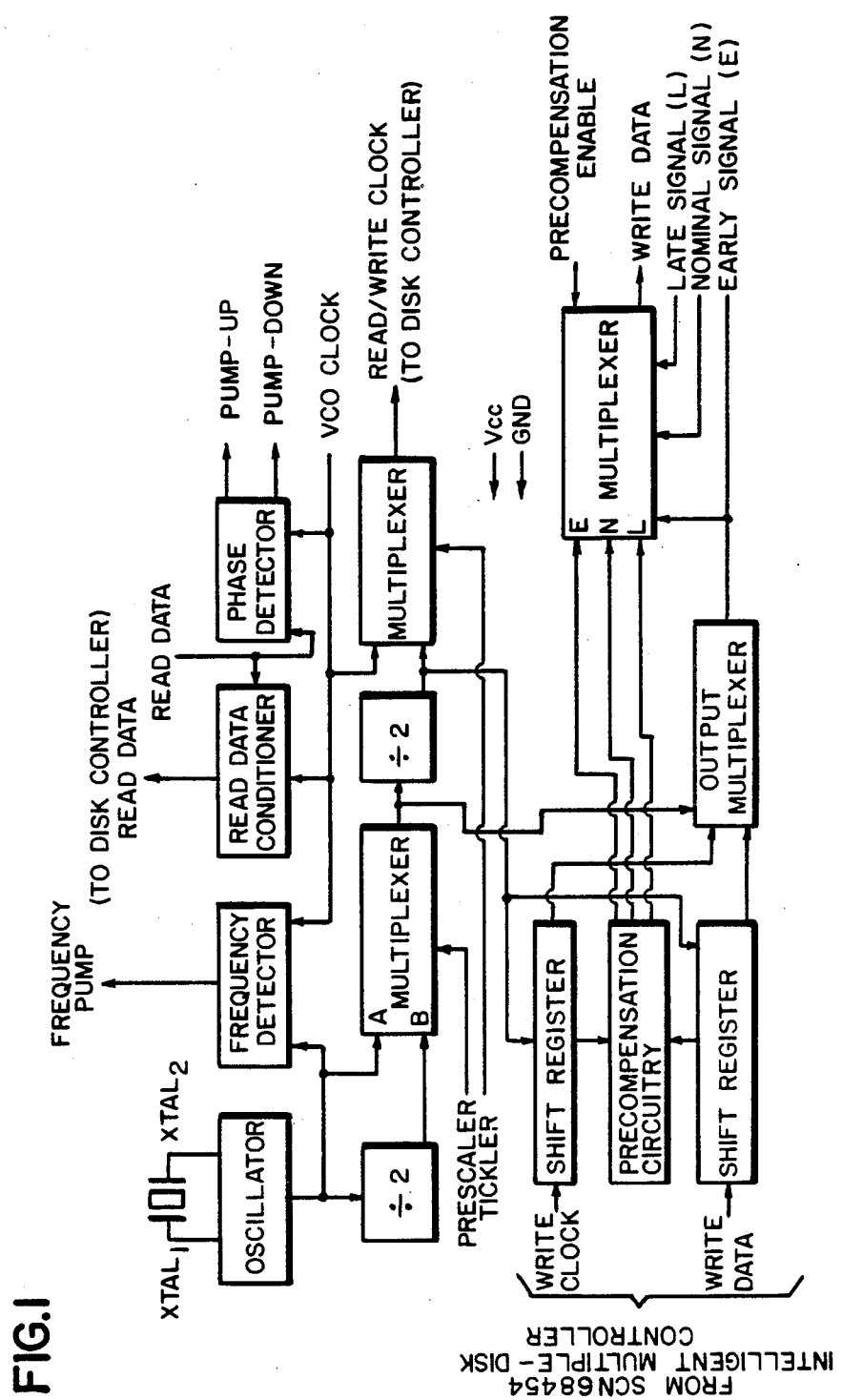
FIG. 1 is a block diagram of a disc phase locked loop circuit in which the circuit of the present invention could be used.

FIG. 1 is a block diagram of a disc phase locked loop as embodied in a 20 pin bipolar intergrated circuit to be sold by Signetics Corporation under the designation SCB 68459. This IC complements the SCN 68454 Intelligent Multiple Disc Controller. Together with an external voltage controlled oscillator, these ICs provide all of the functions necessary to control up to four discs with various type interfaces. Both of these ICs are designed to operate with the Motorola 6800 Microprocessor. The disc phase locked loop uses an external voltage controlled oscillator for the variable clock rate which tracks the read data from the disc unit. This voltage controlled oscillator can be any device which properly interfaces to the disc phase locked loop. The disc phase locked loop operates by producing an oscillator frequency to match the frequency of an input signal. In this locked condition, any slight change in the input frequency, called jitter, will appear as a change in phase between the input frequency and the voltage controlled oscillator frequency. This phase shift then acts as an error signal to change the frequency of the local disc phase locked loop voltage controlled oscillator to match the input signal frequency.

The circuit of the present invention consists of a plurality of interconnected digital logic elements. This circuit receives two input frequencies and generates a pump-up/pump-down signal for control of a phase locked loop. The phase detector has separate outputs for pump-up and pump-down. The detector has a linear relationship between the phase error and the pump-up pulse width, but a fixed pump-down pulse width for all phase errors for which this signal is generated.

Figure 2:
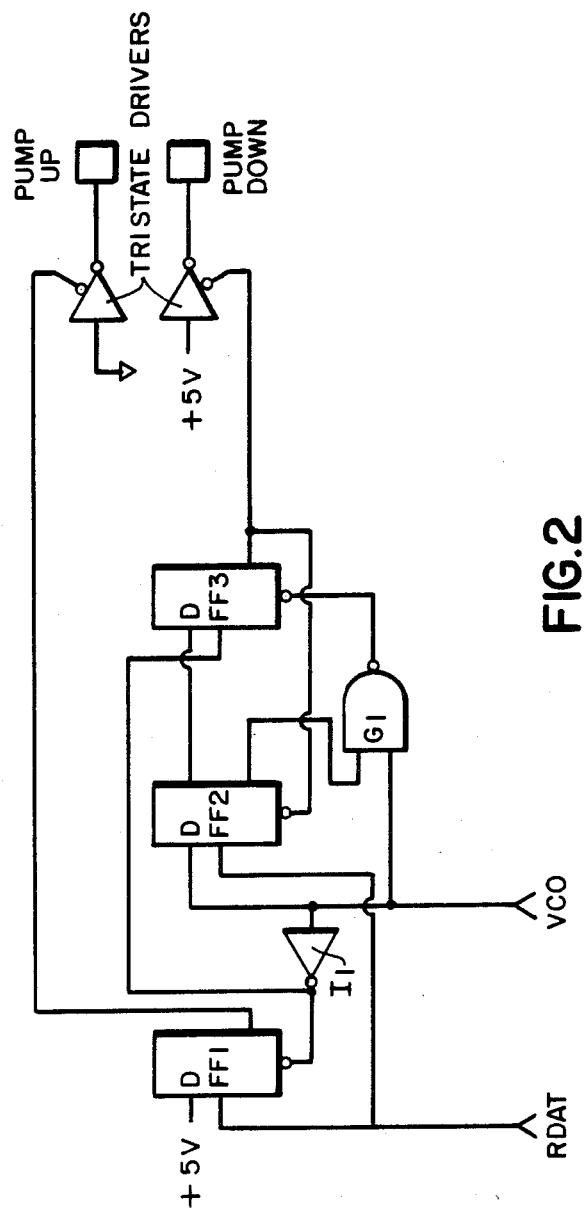
FIG. 2 is a circuit drawing of the phase detector of the present invention for use with the phase locked loop of the circuit of FIG. 1.

The phase detector circuit is a combination of logic elements as shown in FIG. 2. The two frequency inputs are labeled RDAT and VCO, RDAT being the reference input and VCO the output of the loop's voltage controlled oscillator. The outputs of the circuit are labeled pump-down and pump-up. The inputs are assumed to be digital signals. The signals however need not be square waves since only one edge has an effect on the circuit. In the case of FIG. 2, this is the rising edge. Although the signal from the voltage controlled oscillator must be continuous, the RDAT signal may have one or more missing transitions. This would be the case in the typical application for this circuit, recovering the clock from Miller, Manchester or other similar forms of encoded data.

Figure 3:
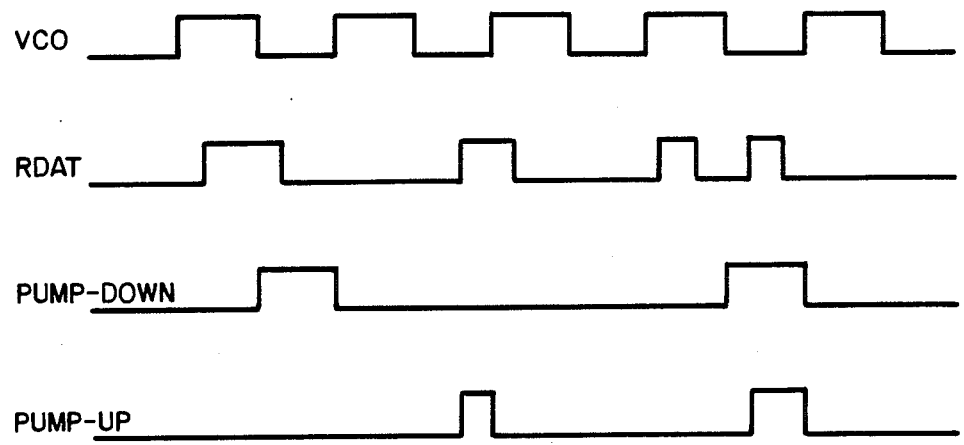
FIG. 3 illustrates some waveforms useful in explaining the operation of the phase detector of FIG. 2.

Referring now to FIGS. 2 and 3, it should be noted that the circuit shown assumes that when the voltage at the input to the voltage controlled oscillator is increased, the output frequency of the VCO increases. It is possible to design the circuit so that voltage controlled oscillator circuits with the reverse characteristic may be used by redefining the relationship between the flip-flop states and the pump-up and pump-down conditions. The starting state is for the output of all three flip-flops to be in their reset, or zero state. The description that follows will show that this state can be reached regardless of any arbitrary starting state.

If a rising edge occurs on RDAT while the VCO signal is low, flip-flop FF1 is set (cf the second rectangular pulse of the RDAT waveform in FIG. 3). While set, the pump-up signal is active. When the signal from the voltage controlled oscillator goes high, the output of inverter I1 goes low resetting flip-flop FF1 thereby terminating the pump-up signal (cf the trailing edge of the first rectangular pulse of the pump-up waveform in FIG. 3). The output of inverter I1 also prevents flip-flop FF1 from being set by positive transitions on the RDAT signal when the VCO signal is high. The width of the pump-up pulse shaped signal produced will vary with the phase difference between the rising edges of the RDAT and VCO signals.

Referring now to the first rectangular pulses of the VCO and RDAT waveforms of FIG. 3, if a rising edge occurs on RDAT while the VCO signal is high, flip-flop FF2 is set. On the next falling VCO edge, the output of inverter I1 goes from low to high and flip-flop FF3 is set, thus causing the Q side of flip-flop FF3 to go low and clear flip-flop FF2. This generates the rising edge of the pump-down signal (FIG. 3). While flip-flop FF3 is set, the pump-down signal is active. When the VCO signal returns to its high state, the output of gate G1 goes low and flip-flop FF3 is cleared, deactivating the pump-down signal. As can be seen from FIG. 3, the width of the pump-down signal is equal to the low period of the VCO waveform.

This logic causes the pump-up signal to be active from a rising edge of RDAT that occurs while VCO is low until VCO rises, while the pump-down signal is active for the full low half clock (VCO) period that follows a rising RDAT edge which occurred during a clock (VCO) high time. The net result is that each rising edge of the RDAT signal results in either a pump-up or a pump-down signal, but not both.

Each output, which in a typical application is sent through a low pass filter before being used to control the frequency of a voltage controlled oscillator, has two states. Since one state is common to both pump-up and pump-down, there is a total of three output states. If pump-up is active, the signal can be thought of as being connected to the positive supply. If pump-down is active, the signal can be thought of as being connected to ground. When inactive, pump-up and pump-down can be thought of as being an open circuit. Thus it is that the three states, pump-up active, pump-down active and inactive are identical to those of the tristate drivers.

The detector thus disclosed has a linear relationship between phase error and pump-up pulse width, but a fixed pump-down pulse width for all phase errors for which the signal is generated. The effect of this operation can be thought of as follows. A normal linear relationship between phase error for both pump-up and pump-down results in a phase error probability distribution that is Gaussian, centered at zero error. In the circuit illustrated in FIG. 2, the resulting distribution is similar except that for a VCO with a positive characteristic the distribution is centered above a point at which the input is leading the VCO by some phase difference. The exact location is determined by the ratio of the two external resistors connected from pump-up and pump-down to the loop's integrating capacitor.

I claim:

1. A phase detector comprising:
    a first input for a source of digital-type pulse signals of a reference frequency,
    a second input for a digital-type signal from a voltage controlled oscillator (VCO), the VCO signal having periodic high and low states.
    first and second outputs for supplying a pump-up and a pump-down signal, respectively, for controlling the VCO frequency,
    first means responsive to signals at the first and second inputs for deriving at said first output a pump-up pulse-type signal if a reference pulse signal appears when the VCO signal is in its low state, the width of the pump-up signal being variable as a function of the phase difference between rising edges of the reference and VCO signals, and second means responsive to signals at the first and second inputs for deriving at said second output a fixed width pump-down pulse-type signal if a reference pulse signal appears when the VCO signal is in its high state.

2. A phase detector as claimed in claim 1 wherein said first and second deriving means are interconnected so that,
    only a pump-up signal is derived when a reference pulse signal at the first input occurs simultaneously with the low state of the VCO signal at the second input, no pump-down pulse being derived at the second output under this condition, and
    only a pump-down signal is derived when a reference pulse signal at the first input occurs simultaneously with the high state of the VCO signal at the second input, no pump-up pulse being derived at the first output under this condition.

3. A phase detector as claimed in claim 1 wherein said first deriving means comprises a bistable device having input means coupled to said first and second inputs and an output coupled to the first output such that the bistable device is inoperative when the VCO signal at the second input is in its high state.

4. A phase detector as claimed in claim 3 wherein the second deriving means comprises:
    a second bistable device having input means coupled to said first and second inputs and output means, a third bistable device having input means coupled to the output means of the second bistable device and to the second input, and output means coupled to the second output and to a further input of the second bistable device, and a gate device having first and second inputs coupled to the output means of the second bistable device and to the second input, respectively, and an output coupled to a further input of the third bistable device.

5. A phase detector as claimed in claim 3 wherein the input means of the bistable device comprises a first input terminal connected to the first input and a reset input coupled to the second input via an inverter whereby the bistable device is reset and thus made inoperative when the VCO signal at the second input is in its high state.

6. A phase detector as claimed in claim 1 wherein said first deriving means comprises a D-type flip-flop including a D input terminal connected to a source of reference voltage, a clock input terminal connected to the first input, and a reset input terminal coupled to the second input via an inverter whereby the flip-flop is reset and thus made inoperative when the VCO signal at the second input is in its high state, and means connecting an output terminal of the flip-flop to said first output.

7. A phase detector as claimed in claim 6 wherein the second deriving means comprises:

a second D-type flip-flop having a D input terminal connected to the second input, and a clock input terminal connected to the first input, a third D-type flip-flop having a D input terminal connected to a first output terminal of the second flip-flop and a clock input terminal connected to the second input via said inverter, a gate circuit having a first input terminal connected to a second output terminal of the second flip-flop and a second input terminal connected to said second input, means connecting an output of said gate circuit to a reset input terminal of the third flip-flop, and means coupling an output of the third flip-flop to the second output and to a reset input terminal of the second flip-flop.

8. A phase detector as claimed in claim 1 further comprising means for interconnecting said first and second deriving means so that only a pump-up or a pump-down signal is derived for a given reference pulse, but not both, the pump-up signal being derived when the reference pulse signal occurs at the same time that the VCO signal is in its low state and the pump-down signal being derived when the reference pulse signal occurs at the same time that the VCO signal is in its high state.

9. A phase detector as claimed in claim 8 wherein the second deriving means includes a flip-flop device triggered into its set state at the next falling edge of a VCO pulse signal that occurs after the occurrence of a reference pulse signal at a time when the VCO signal is in its high state, the second output being coupled to an output of said flip-flop device, and a gate circuit for resetting said flip-flop device at the next rising edge of the VCO pulse signal that occurs after the flip-flop is set, whereby the width of the pump-down pulse signal at the second output is equal to the width of the VCO signal in its low state.

* * * * *